United States Patent
Wu

(10) Patent No.: US 6,265,354 B1
(45) Date of Patent: Jul. 24, 2001

(54) METHOD OF PREPARING BISMUTH OXIDE SUPERCONDUCTOR

(76) Inventor: Hengning Wu, 11627 N. Shore Dr., #2B, Reston, VA (US) 20190

( * ) Notice: Subject to any disclaimer, the term of this patent is extended or adjusted under 35 U.S.C. 154(b) by 0 days.

(21) Appl. No.: 09/659,218

(22) Filed: Sep. 11, 2000

(51) Int. Cl.$^7$ .......................... C04B 35/626; C04B 35/64
(52) U.S. Cl. .......................... 505/430; 505/433; 505/501; 505/492; 505/740
(58) Field of Search .................... 505/300, 440, 505/501, 430, 433, 492, 740

(56) References Cited

U.S. PATENT DOCUMENTS

| | | |
|---|---|---|
| 4,952,554 | 8/1990 | Jin et al. . |
| 4,983,576 | 1/1991 | Hagino et al. . |
| 5,068,219 | 11/1991 | Hagino et al. . |
| 5,324,712 * | 6/1994 | Su .................................... 505/492 |
| 5,354,535 | 10/1994 | Dorris et al. . |
| 5,468,566 | 11/1995 | Dorris et al. . |
| 5,610,123 | 3/1997 | Sato et al. . |
| 5,874,384 | 2/1999 | Balachandram et al. . |
| 6,069,116 | 5/2000 | Li et al. . |

OTHER PUBLICATIONS

S.E. Dorris, et al., Physica C (1994), vol. 223, pp. 163–172, Elsevier.

J.Jiang and J.S. Abell, Supercond. Sci. Technol. 10 (1997) 678–685.

R. Flükiger, et al, Supercond. Sci. Technol. 10 (1997) A68–A92.

* cited by examiner

*Primary Examiner*—Mark Kopec

(57) ABSTRACT

The present invention provides a method to prepare a (Bi,Pb)SrCaCuO-2223 superconductor, in particular a (Bi, Pb)SrCaCuO-2223 superconducting wire with improved critical current density at reduced cost. In the method of preparing a (Bi,Pb)SrCaCuO-2223 superconducting wire comprising the steps of filling precursor powder into a metal sheath, working the same into a wire by performing deformation processing in this state, and heat treating the wire, the precursor powder is prepared from a powder containing a fully doped 2212 phase and a powder containing an underdoped 2212 phase. This precursor powder provides the advantage of better texture formation, faster and more homogeneous reaction to form the 2223 phase, and improved connectivity between the 2223 grains during the heat treatment process, leading to improved critical current density. Furthermore, the method offers a possibility to use metals other than a silver-based material in the sheath material, thus significantly reducing the materials cost of the (Bi,Pb)SrCaCuO-2223 superconducting wire. In the method of preparing a (Bi,Pb)SrCaCuO-2223 superconductor, the same mechanism is used to improve the texture formation and critical current density of monolithic and thick film superconductors.

25 Claims, No Drawings

METHOD OF PREPARING BISMUTH OXIDE SUPERCONDUCTOR

BACKGROUND OF THE INVENTION

The present invention relates to a method of preparing a (Bi,Pb)SrCaCuO-2223 superconductor, and in particular a (Bi,Pb)SrCaCuO-2223 superconducting wire. The superconductor with a nominal composition of (Bi,Pb)$_2$Sr2Ca$_2$Cu$_3$O$_x$, the 2223 phase with a superconducting transition temperature of 110 K, has a variety of industrial applications. Brides its uses in the monolithic forms, it has been made into superconducting composite wires with promising performance for an even more wide range of engineering applications. A successful method of preparing a superconducting wire is the so-called oxide powder-in-tube (OPIT) process (S. Jin et al., U.S. Pat. No. 4,952,554, 1990). The OPIT process includes the three stages of preparing a powder of superconductor precursor oxides (precursor powder preparation stage); filling the precursor powder into a metal tube and reducing the cross section of the tube through mechanical deformation such as swaging, rolling or drawing, and for multifilamentary articles, assembling the previously formed bundles and further deforming the assembly into a multifilamentary wire or tape (mechanical deformation stage); and subjecting the composite to a sintering process, and if necessary, repeated deformation (pressing or rolling) and sintering processes, to obtain the desired superconducting properties (thermomechanical processing stage). The precursor powder preparation stage provides the starting precursor powder with appropriate composition, phase assembly, and particle size. The mechanical deformation stage provides the required geometry of the composite and more importantly the texture formation of the precursor powder. The thermomechanical processing stage is responsible for the final phase transformation into the superconducting 2223 phase and related superconducting properties. Since the 2223 phase is thermodynamically metastable and will decompose at the sintering temperature, direct use of the 2223 phase as the starting powder for the OPIT process will result in poor superconducting properties. Therefore, a powder of precursor oxides corresponding to the cation composition of the final 2223 phase is used as the starting powder. The 2223 phase has a wide solid solution range and the actual composition is slightly different from the nominal composition of (Bi,Pb)$_2$Sr$_2$Ca$_2$Cu$_3$O$_x$. For example, a commonly used composition is Bi$_{1.72}$Pb$_{0.34}$Sr$_{1.83}$Ca$_{1.97}$Cu$_{3.13}$O$_x$. The precursor powder, upon one or more subsequent chemical reactions, is then converted into the 2223 superconducting material in combination with greater or lesser amounts of secondary phases. Because the desired 2223 superconducting material is formed by a series of chemical reactions, the superconducting properties will depend on the chemical and phase composition of the starting materials and on the subsequent processing conditions, such as temperature, time, and oxygen partial pressure.

A common phase composition of the precursor powder consists of a tetragonal or orthorhombic 2212 phase, and one or more nonsuperconducting phases necessary for the final conversion into the 2223 phase. The tetragonal 2212 phase has equivalent a and b axes with a lattice parameter of about 5.4 angstroms. The conversion of the tetragonal to the orthorhombic phase corresponds to the formation of an oxygen deficient structure with unequal a and b axes, as described in R. Flukiger et al., Phase formation and critical current density in Bi,Pb(2223) tapes, Supercond. Sci. Technol. 10 (1997) pages A68–A92. The conversion occurs simultaneously with the incorporation of a dopant having a variable oxidation state, i.e., Pb or Sb, into the structure. The secondary phases may be considered desirable secondary phases such as, (Ca,Sr)$_2$CuO$_3$, CuO, (Ca$_{2-x}$ Sr$x$)PbO$_4$ and (Ca$_{2-x-y}$ Sr$_x$ Cu$_y$)(Pb$_{1-n}$ Bi$_n$) O$_z$ (3221 phase), which promote the formation of the 2223 phase and decrease the size of impurity phases, depending on the sintering conditions. Undesirable second phases may include 2201, 3221, CaCuO$_2$, and un-reacted metal oxides depending on the particular sintering conditions.

When tetragonal 2212 is used in the precursor powder, a transient liquid phase is first formed and tetragonal 2212 is converted into Pb-doped orthorhombic 2212 during the sintering process. The Pb-doped 2212 phase then reacts with other oxide phases to form the 2223 phase. The transient liquid will promote densification and grain growth. However, oxygen must be released during the conversion from tetragonal 2212 to orthorhombic 2212 phase. The oxygen release may be limited by the diffusion of oxygen through the silver sheath and newly formed phases, and inhomogeneous phase formation may occur due to the difference in local oxygen partial pressure, and bubbles may form in the composite wire due to the released oxygen. Repeated pressing/rolling and sintering are often necessary to achieve a high critical current density. A prior art method releases the oxygen before the sintering process by adding a tetragonal to orthorhombic conversion process in the mechanical deformation stage (Q. Li, et al., U.S. Pat. No. 6,069,116, 2000). Although this approach is successful in achieving a high critical current density, the diffusion of oxygen through the silver sheath is a time consuming process. Moreover, the choice of sheath materials is limited to silver-based materials as silver is the only metal permeable to oxygen. When the 2212 phase in the precursor powder is a fully Pb-doped orthorhombic phase, all the Pb in the final composition is essentially in the 2212 phase. Faster reaction kinetics and more complete transformation into the 2223 phase were observed for such a precursor powder, as discussed in S. E. Dorris, et al., Methods of introducing lead into bismuth-2223 and their effects on phase development and superconducting properties, Physica C 223 (1994) pages 163–172. Furthermore, the orthorhombic 2212 phase seems to develop better deformation texture during the mechanical deformation process. However, the connectivity may be not as good compared with the powder with the tetragonal 2212 phase and the critical current density may be adversely affected accordingly.

It is recognized the transformation from tetragonal to orthorhombic 2212 is a continuous process depending on the temperature, oxygen partial pressure, and time of the calcination process. The Pb content and the lattice parameters of the 2212 phase are between the two extreme cases. A well-controlled calcination process should produce the desired 2212 phase with a narrow Pb content range. However, variations in the processing condition can produce a powder with Pb content of the 2212 phase spreading the whole composition range. The temperature and oxygen partial pressure range of each phase can be obtained from published phase diagrams. The powder phase composition moves from tetragonal 2212 to orthorhombic 2212 with increasing Pb content as the temperature or oxygen partial pressure shifts from the tetragonal range to the orthorhombic range. It seems that the best results in critical current density have been obtained from precursor powders with the tetragonal 2212 phase and better reproducibility is obtained from precursor powders with fully doped orthorhombic 2212 phase.

It is also suggested that presence of certain amount of the 2223 phase in the precursor powder may act as seeds to promote the 2223 formation kinetics and improve the critical current density (K. Sato et al., U.S. Pat. No. 5610123, 1997). However, the values of critical current density obtained by this method are not as high as the best results from the precursor powders with the tetragonal 2212 phase. The precursor powder preparation methods can also be divided into two categories according to the calcinations method: so-called one-powder process and two-powder process (see, for example, J. Jiang and J. S. Abell, Effects of precursor powder calcination on critical current density and microstructure of Bi-2223/Ag tapes, Supercond. Sci. Technol. 10 (1997) pages 678–685). In a one-powder process, all the materials are mixed and calcined together. In a two-powder process, the preparation of the Pb-doped 2212 phase is separated from the preparation of the remaining oxide phases, then the two powders are mixed to form the precursor powder (S. E. Dorris et al., U.S. Pat. No. 5,468,566, 1995, and S. E. Dorris, et al., U.S. Pat. No. 5,354,535, 1994). The two-powder process may offer better quality control since the phases and particle sizes of the two powders can be controlled independently.

As for the sheath material, a silver-based material is the material of choice. Noble metals are the only metallic materials that do not have adverse reactions with the superconducting precursor powder. Among the noble metals silver is the only material permeable to oxygen. Silver-based materials include silver, silver alloys with other noble metals, and silver enhanced with dispersed oxides such as MgO. Direct use of other metals as the sheath material is not feasible due to chemical reaction and oxygen diffusion. For short samples of a few centimeters in length, oxygen can pass through the ends of the wire, but this is not practical for industrial wires of hundreds of meters in length. A proposed prior art method to reduce the material cost is to use an inexpensive metal to replace silver at the outer surface and there are holes in the metal packed with silver so that oxygen diffusion can take place at these openings (S. Hagino, et al., U.S. Pat. No. 4,983,576, 1991, and S. Hagino, et al., U.S. Pat. No. 5,068,219, 1991). However, such a construction makes the mechanical deformation and the thermomechanical processing very difficult. It is also well known that there is a dense, well-textured layer of about 2–3 $\mu$m in the 2223 phase at the silver interface, which has a very high critical current density. At the center of a superconducting filament, the microstructure may be porous, the texture may be not as good, and the critical current density may be lower. A very high critical current density value is obtained in a prior art wire-in-tube method where a thin layer of superconductor is formed between the gap of the inside silver wire and the outside silver tube (U. Balachandran et al., U.S. Pat. No. 5,874,384, 1999). However, the engineering critical current density is not high due to the low packing ratio of the superconductor. Progress has been made in improving the engineering critical current density by increasing the superconductor-silver interface, but this is limited by the formation of interlinks between the superconducting filaments when the filaments and the silver layers between them become thinner and thinner. A method to improve the texture formation inside the filament is a more desirable solution.

SUMMARY OF THE INVENTION

Accordingly, an object of the present invention is to provide a method of preparing a bismuth oxide superconductor, and in particular a bismuth superconducting wire, which improves the texture formation of a (Bi,Pb) SrCaCuO-2223 phase through the whole thickness of the superconductor, thus attaining a high critical current density and engineering critical current density.

Another object of the present invention is to provide a method of preparing a bismuth oxide superconductor, which can improve the reaction kinetics and homogeneity for the formation of the superconducting 2223 phase, thus reducing the processing time and improving the performance of the superconductor.

Still another object of the present invention is to provide a method of reducing the materials cost of the sheath in the superconducting composite.

The present invention provides a means of preparing the precursor powder to a specified phase composition for the preparation of a (Bi,Pb)SrCaCuO-2223 superconducting wire. In general, the basic method according to the present invention comprises the steps of.

preparing a first powder containing a fully doped 2212 phase having a Pb content close to the final amount, and non-superconducting phases mixed therewith;

preparing a second powder containing an under-doped 2212 phase having a Pb content less than half the final amount, and non-superconducting phases mixed therewith;

mixing the first powder and the second powder in a proper proportion to form a starting precursor powder;

filling the starting powder into a metal sheath;

performing deformation processing on the metal sheath to form a composite wire and develop texture in the 2212 superconducting phases;

performing thermomechanical processing to obtain the (Bi,Pb)SrCaCuO-2223 phase with a high critical current density.

The solubility of Pb in 2212 depends on the composition, temperature and oxygen partial pressure. Phase diagrams for the temperature and oxygen partial pressure dependence of the solubility are available in the literature for some compositions. See, for example, P. Majewski, Phase diagrams studies in the system Bi-Pb—Sr—Ca—Cu—O—Ag, Supercond. Sci. Technol. 10 (1997) pages 453–467. It can also be determined experimentally for a particular composition. Generally speaking, the solubility is larger for lower oxygen partial pressures. Given an oxygen partial pressure, such as air at ambient pressure, the solubility increases with temperature until a maximum value is reached. By choosing the proper composition, temperature, and oxygen partial pressure, the 2212 phase with the desired Pb content can be prepared.

It is known that during the sintering process, the first reaction is a transformation of the un-doped tetragonal or under-doped orthorhombic 2212 phase into the Pb-doped 2212 orthorhombic phase, and then the (Bi,Pb)2212 phase reacts with other phases to form the desired 2223 phase, as summarized in R. Flukiger et al., Phase formation and critical current density in Bi,Pb(2223) tapes, Supercond. Sci. Technol. 10 (1997) pages A68-A92. The liquid-assisted reaction to form the (Bi,Pb)2212 phase causes significant grain growth. Because of the heavy mechanical deformation, the particle size of 2212 before sintering can be extremely small, even amorphous for some powders. The newly formed grains do not necessarily follow the texture of its precursor. On the interface of silver, there is an interface-induced texture formation. In the center part, grains can grow in other directions, usually causing swelling of the wire. Therefore, the present invention uses two 2212 phases to take advantage of the better deformation characteristic of a fully doped orthorhombic (Bi,Pb)2212 phase and the liquid formation associated with a tetragonal 2212 phase or underdoped orthorhombic 2212 phase. The fully doped orthorhombic (Bi,Pb)2212 phase will develop better texture during the mechanical deformation process. During the initial sintering process, the fully doped (BiPb)2212 phase does not have any phase transformation, thus keeping its original texture. Its grain size may increase. The tetragonal or under-doped orthorhombic 2212 phase will undergo the liquid-assisted reaction to form the (Bi,Pb)2212 phase. With the presence of the pre-existing textured (Bi,Pb)2212 phase, the growth of the newly formed (Bi,Pb)2212 grains in directions different from these allowed by the texture is limited to the distance between the plates of the original (Bi,Pb)2212 phase. These smaller grains are more likely to be consumed in the sintering process. Therefore, the pre-existing (Bi,Pb)2212 phase effectively acts as a template for texture formation. This eventually will result in better texture formation, densification, and connectivity of the 2223 phase. According to the present invention, due to this extra texture mechanism, relatively thick superconducting filaments can be used while maintaining the level of texture formation and thus a high critical current density in the superconducting wire. As the grains are better aligned a denser microstructure will be obtained.

In prior art methods, the 2212 phase has one composition with a certain scattering due to variations in processing conditions such as temperature, oxygen partial pressure, and chemical composition. Therefore, it is not possible to combine the advantages of both 2212 phases. When tetragonal 2212 is used, the texture may be not good. When the fully doped (Bi,Pb)2212 phase is used, Pb is not present in the remaining phases and not enough liquid is formed. In between, the 2212 composition is not the optimum composition as discussed above. A systematic study of the effect of the Pb content in 2212 in a prior art method can be found in S. E. Dorris, et al., Methods of introducing lead into bismuth-2223 and their effects on phase development and superconducting properties, Physica C 223 (1994) pages 163–172.

It should be emphasized that the composition of the phase is more important than the structure. For example, when the calcination condition is in the range with a low solubility limit of Pb in the 2212 phase, a mixture of the tetragonal 2212 and the under-doped orthorhombic 2212 phase may be produced, but the under-doped orthorhombic 2212 phase cannot act as a template. On the other hand, a powder can have all the 2212 phases in the orthorhombic structure and good texture will be developed according to the present invention when one 2212 phase is fully doped and the other is under-doped.

It should be pointed out that in some prior art methods the Pb content of the 2212 phase may spread through the whole composition range due to extreme variations in processing conditions. For example, vacuum degassing of a powder with the tetragonal 2212 phase for a very short time may convert a part of the powder into the orthorhombic 2212 phase. Chemical segregation in a powder before calcination may also cause extreme composition variations. However, it is difficult to control the composition and amount of different 2212 phases in those situations. This may account for the poor reproducibility of some very good results of critical current density obtained from powders with the tetragonal 2212 phase. The present invention provides an efficient and consistent method to obtain the proposed phase assembly.

According to the present invention, the Pb content of the fully doped (Bi,Pb)2212 phase should be preferably within ±15% of the final composition, and more preferably within ±10% of the final composition, and most preferably within ±5% of the final composition. The Pb content of the under-doped 2212 phase should be less than 50%, preferably less than 20%, and more preferably less than 10% of the final composition.

According to the present invention, the amount of the fully doped (Bi,Pb)2212 phase should be preferably around 10% to 60% of the total volume of the starting powder. The weight percentage can be calculated from the density of all the phases. The optimum volume percentage will also be related to other processing factors. For most powders, a more preferred volume percentage is from 20% to 30%.

According to the present invention, the particle size of the precursor powder is preferably less than 5 $\mu$m, and more preferably less than 2 $\mu$m. Especially, the particle size of nonsuperconducting phases should be much smaller, preferably less than 1 $\mu$m and more preferably less than 0.5 $\mu$m. To fully control the particle size, the 2212 phases can be prepared separately from the remaining oxide phases. Therefore, different techniques can be applied to each phase or mixture of phases. These techniques include freeze drying, spray pyrolysis, co-precipitation, co-decomposition, and mechanical grinding.

It is known that oxygen release is a problem when the tetragonal 2212 phase is used in the precursor powder and Pb mainly exists in the $Ca_2PbO_4$ structure. A prior art approach adds an oxygen release treatment of the wire before the rolling and sintering process (Q. Li, et al., U.S. Pat. No. 6,069,116, 2000). Since oxygen diffusion through silver sheath is involved, this is a time-consuming process. An alternative approach used in the present invention is to address the oxygen problem at the precursor preparation stage. In the present invention, part of the Pb exists in the 2212 phases, the oxygen release problem is alleviated. To further reduce the oxygen content, the 2212 phases and other oxide phases can be quenched from the calcination temperature to retain the low oxygen content. PbO ($Pb^{+2}$) can be used to partially replace $Ca_2PbO_4$ ($Pb^{+4}$).

In one aspect of the present invention, the oxygen content of the precursor powder is adjusted to around the value of the final 2223 phase so that metals other than silver can be used as the sheath material to reduce the materials cost of the superconducting wire. Accordingly, the sintering condition will be changed from the normal constant oxygen partial pressure environment to a fixed oxygen content environment. Such replacements are also beneficial for special purposes such as high strength and low thermal conductivity. Since the precursor powder reacts with most metallic materials at the sintering temperature, the first step is to use a silver-based material as the sheath material for each individual filament but replace the silver-based material with another metal as the outside sheath material in a multifilamentary wire. A metal with little solubility with silver is preferred, such as nickel. When a metal (such as copper) with a large solubility with silver is used, a diffusion barrier layer will be applied. Apparently, the replacement metal should have a melting temperature higher than 850° C. and enough plasticity to withstand the mechanical deformation process. A suitable metal can be chosen from a group consisting of carbon steels, stainless steels, superalloys, nickel and nickel alloys, copper and copper alloys, titanium and titanium alloys.

To replace silver in the inner sheath, a strong and coherent buffer layer should be developed between the superconductor and the metal sheath. The buffer layer can be chosen from a group consisting of silver, silver alloy, and oxides that do not react with the precursor powder such as MgO and $BaZrO_3$.

In another aspect of the present invention, the precursor preparation and texture formation method can also be used to produce textured monolithic 2223 superconductors, thick film 2223 superconductors on metal or ceramic substrate, and ceramic multi-layer structure. Once an initial texture is developed in the 2212 phases during the forming process, the texture will be enhanced in the sintering process for the formation of the 2223 phase due to the same mechanism.

By "wire", as the term is used herein, it is meant an elongated article with its length dimension significantly larger than the dimensions of the cross section. It is equivalent to a tape, a ribbon, a rod, or the like, used in the literature.

By "fully doped 2212", as the term is used herein, it is meant a 2212 phase with a Pb content close to the final composition of the 2223 phase. Put it another way, nearly all the Pb intended to be incorporated into the 2223 phase is in the 2212 phase. By "under-doped 2212", as the term is used herein, it is meant a 2212 phase with a Pb content less than 50% of the value in the final composition of the 2223 phase.

The dopant Pb can be partially or completely replaced by Sb. For simplicity, Pb dopant is used in the discussion and examples. Pb is also the preferred dopant.

DETAILED DESCRIPTION OF THE INVENTION

In order to carry out the method of preparing a (Bi,Pb)SrCaCuO-2223 superconductor according to the present invention, first prepared is a powder which contains a 2212 phase with a Pb content close to the value of the final (Bi,Pb)SrCaCuO-2223 composition. Depending on the composition and processing conditions, certain non-superconducting phases may also be present in the powder. The calcination temperature and oxygen partial pressure are chosen so that the desired 2212 composition is within the solubility limit of Pb.

A second powder is prepared which contains a 2212 phase with a Pb content less than 10% of the value of the final (Bi,Pb)SrCaCuO-2223 composition. The remaining Pb content is in the nonsuperconducting phases.

Then, appropriate amount of the first powder is mixed with the second powder to give the volume fraction of 20% to 30% to the fully doped 2212 phase. Additional nonsuperconducting oxide phases may be added to obtain the final composition. The powder is pulverized, into a particle size less than 5 $\mu$m, preferably less than 2 $\mu$m, with a ball mill, a micromill, an attriter, or the like, preferably in a glove-box filled with dry nitrogen or argon to avoid pick-up of moisture.

To prepare a superconducting composite wire, the precursor powder is then filled into a metal sheath of preferably silver-based materials. The metal sheath thus filled with the precursor powder is subjected to deformation processing such as swaging, drawing, extrusion, and rolling. The deformation process reduces the size of the composite to form a single filament wire. For a multifilamentary wire, the composite wire of single filament is cut into many sections and bundled together into another metal sheath, and the deformation process is repeated. To develop texture in the precursor 2212 phase, a rolling deformation with a total deformation ratio of at least 70% is applied to produce a tape-like composite wire.

Then the composite wire is heat treated to form the (Bi,Pb)SrCaCuO-2223 phase. The optimum sintering temperature is related to the oxygen partial pressure. Generally speaking, a reduced oxygen partial pressure of 8% to 10% gives a wide processing temperature window around 800° C. to 830° C. If a second or third heat treatment should be applied, a deformation of about 10% is applied to increase the density and texture before the heat treatment. To use metals other than a silver-based material in the sheath, the oxygen content is further controlled to close to the value of the final (Bi,Pb)SrCaCuO-2223 phase. An advantage of the 2223 phase over other high temperature superconductors is that its superconducting transition temperature is not very sensitive to the oxygen content. The oxygen content of the 2223 phase and the precursor powder are first measured. Then the amount of the precursor phases can be adjusted accordingly.

To use the precursor powder to make monolithic or thick film superconductors, the texture formation can be achieved by, for example, magnetic alignment, tape casting, pressing, dip coating, and extrusion. Then sintering is carried out in a similar way but at a slightly higher temperature.

The present invention will be further illustrated by the following examples.

EXAMPLE 1

$Bi_2O_3$, PbO, $SrCO_3$, $CaCO_3$ and CuO are mixed to get the cation ratio of Bi, Pb, Sr, Ca and Cu of 1.75:0.35:1.90:2.05:3.05. The materials are thoroughly ground to a particle size of less than 5 $\mu$m. The mixture is pressed into pellets and calcined twice with intermediate grinding at 750° C. and 800° C. respectively for 8–12 hours in $CO_2$-free flowing air. Then the material is ground again and divided into two parts. The first part is calcined at 800° C. in 1% oxygen (balance nitrogen or argon) for about 8 hours, and the obtained material contains fully doped 2212 and nonsuperconducting phases. The second part is calcined at 800° C. in atmospheric air for about 8 hrs and the obtained material contains 2212 with a small amount of Pb content and Pb mainly exists in $(Sr,Ca)_2PbO_4$. Then the first powder is mixed with the second powder in a weight ratio of about 3:7. The mixture is pulverized to obtain a precursor powder with a particle size less than 5 $\mu$m and preferably less than 2 $\mu$m.

The precursor powder is filled into a silver or silver alloy tube of 25 mm outer diameter and 22 mm in inner diameter, which in turn is swaged into 12 mm in diameter, drawn into 1 mm in diameter, and then rolled into 0.20 mm in thickness. The reduction ratio for each pass is around 20%.

For a 19 filament multifilamentary wire, the single filament wire discussed above is cut into 19 sections of equal length when the diameter is 4.0 mm. The single filament sections are packed into a silver or silver alloy tube of 25 mm in outer diameter and 22 mm in inner diameter, which in turn is swaged into 12 mm in diameter, drawn into I mm in diameter, and then rolled into 0.20 mm in thickness. The reduction ratio for each pass is around 20%.

The as-formed tape-type wires are heat treated at about 815° C. in 8% oxygen partial pressure for 5 hours, again rolled into 0.18 mm in thickness, and thereafter heat treated at 815° C. for 40 hours and slowly cooled to room temperature.

EXAMPLE 2

A commercial precursor powder with tetragonal 2212 and other nonsuperconducting phases will be used in this example. Such a powder can be purchased from many suppliers in the world, such as Superconductive Component Company in Ohio, USA, and Merck in Germany.

As-supplied powder should have a particle size less than 2 µm. A part of the powder is further treated in 1% oxygen at 800° C. for 2 to 8 hrs. The optimum time is determined by the nature of the particular powder used and can be determined experimentally. X-ray diffraction (XRD) can be conducted on powders after a series of different heat treatment time period. The time when the peak for $(SrCa)_2 PbO_4$ does not show any significant decrease afterwards can be used as the optimum time for heat treatment. Then the two powders can be mixed to form a precursor powder as described in Example 1.

The precursor powder is used to prepare a superconducting wire as described in Example 1.

EXAMPLE 3

$Bi_2O_3$, PbO, $SrCO_3$, $CaCO_3$ and CuO are mixed to get the cation ratio of Bi, Pb, Sr, Ca and Cu of 1.75:0.35:2.0:1.0:2.0. The materials are thoroughly ground to a particle size of less than 5 µm. The mixture is pressed into pellets and calcined twice with intermediate grinding at 750° C. and 800° C. respectively for 8 12 hours in $CO_2$-free flowing air. Then the material is ground again and calcined at 800° C. in 1% oxygen (balance nitrogen or argon) for about 8 hours, and the obtained material is essentially single phase fully doped 2212.

$Bi_2O_3$, $SrCO_3$, $CaCO_3$ and CuO are mixed to get the cation ratio of Bi, Sr, Ca and Cu of 2.15:2.0:1.0:2.0. The materials are thoroughly ground to a particle size of less than 5 µm. The mixture is pressed into pellets and calcined twice with intermediate grinding at 750° C. for 8–12 hr and 800° C. for about 24 hours respectively in $CO_2$-free flowing air. The obtained material is single phase tetragonal 2212.

The composition of the balance oxide phases can then be calculated from the required phase ratio and the final composition. Then appropriate amount of oxides are thoroughly ground to a particle size of less than 5 µm. The mixture is pressed into pellets and calcined twice with intermediate grinding at 750° C. for 8–12 hr and 800° C. for about 24 hours respectively in $CO_2$-free flowing air.

The three powders are ground separately to obtain a particle size of less than 2 µm. Especially the balance oxides powder is preferably ground to sub-micron size, more preferably to a particle size of less than 0.5 µm. Then the powders are wet mixed according to the required ratio and afterwards dried to produce a precursor powder for the preparation of the 2223 superconductor.

The advantage of this method is that the particle sizes of the components can be controlled independently.

The precursor powder is used to prepare a superconducting wire as described in Example 1.

EXAMPLE 4

A first powder with fully doped 2212 is prepared according to the procedure shown in Example 1. Then the powder with the under-doped 2212 phase is prepared by decomposition of the first powder in a temperature and oxygen partial pressure range beyond the solubility limit. In this case, the powder is treated at 750° C. in pure oxygen for about 8 hrs. The two powders are then mixed in the desired ratio to form a precursor powder in the same way as described in Example 1.

The precursor powder is used to prepare a superconducting wire as described in Example 1.

EXAMPLE 5

This example shows the use of a two-temperature zone furnace to produce the precursor powder.

$Bi_2O_3$, PbO, $SrCO_3$, $CaCO_3$ and CuO are mixed to get the cation ratio of Bi, Pb, Sr, Ca and Cu of 1.75:0.35:1.90:2.05:3.05. The materials are thoroughly ground to a particle size of less than 5 µm. The mixture is pressed into pellets and calcined twice with intermediate grinding at 750° C. and 800° C. respectively for 8–12 hours in $CO_2$-free flowing air. Then the material is ground again and divided into two parts. The first part is placed at a temperature zone of about 845° C. and the second part is placed at a temperature zone of 800° C., and the calcination is performed for 8 hrs in $CO_2$-free flowing air. The first powder contains fully doped 2212 and the second powder contains tetragonal 2212 and under-doped 2212. Then the first powder is mixed with the second powder in a weight ratio of about 3:7. The mixture is pulverized to obtain a precursor powder with a particle size less than 5 µm and preferably less than 2 µm.

Similarly, two powders can be obtained in one calcination step using a furnace with separate zones of different oxygen partial pressures. Another ramification is calcination of two powders with different Pb content at the same time at a processing condition for the formation of the fully doped 2212 phase. Such techniques will save processing time and energy.

EXAMPLE 6

This example will show how to balance the oxygen content of the precursor powder. The oxygen content range of the final 2223 phase can be determined experimentally by chemical analysis. The major source of oxygen release is caused by the valence change of $Pb^{+4}$ in $(Sr,Ca)_2PbO_4$ to $Pb^{+2}$ in the superconducting phases. Therefore, partial or complete replacing of $(Sr,Ca)_2PbO_4$ by PbO can be used to decrease the oxygen content of the precursor powder.

$Bi_2O_3$, PbO, $SrCO_3$, $CaCO_3$ and CuO are mixed to get the cation ratio of Bi, Pb, Sr, Ca and Cu of 1.75:0.35:1.90:2.05.3.05. The mixture is thoroughly ground to a particle size of less than 5 µm. The mixture is pressed into pellets and calcined twice with intermediate grinding at 750° C. and 800° C. respectively for 8–12 hours in $CO_2$-free flowing air. Then the material is ground again and calcined at 800° C. in 1% oxygen (balance nitrogen or argon) for about 8 hours and then quenched to room temperature to obtain the first powder. $Bi_2O_3$, PbO, $SrCO_3$, $CaCO_3$ and CuO are mixed to get the cation ratio of Bi, Pb, Sr, Ca and Cu of 1.75:0.04:1.90:2.05:3.05. The mixture is calcined in the same way as above. The amount of Pb in this powder can be adjusted to change the oxygen content of the final precursor powder. PbO is then added to make the second powder with a composition ratio of Bi, Pb, Sr, Ca and Cu of 1.75:0.35:1.90:2.05:3.05.

Then the first powder is mixed with the second powder in a weight ratio of about 3:7. The mixture is pulverized to obtain a precursor powder with a particle size less than 5 µm and preferably less than 2 µm.

EXAMPLE 7

This example will show the use of metals other than silver as part of the sheath material. Now the sintering condition is changed from the normal constant oxygen partial pressure environment to a fixed oxygen content environment. Therefore, it is necessary to start with the right oxygen content.

The precursor powder prepared in Example 6 will be used. The precursor powder is filled into a silver or silver alloy tube of 25 mm outer diameter and 22 mm in inner diameter, which in turn is swaged into 12 mm in diameter, drawn into 4.0 mm in diameter. The single filament wire is cut into 19 sections of equal length. The single filament sections are packed into a nickel or nickel alloy tube of 25 mm in outer diameter and 22 mm in inner diameter, and the tube is then pumped to vacuum and sealed by welding. The composite is swaged into 12 mm in diameter, drawn into 1 mm in diameter, and then rolled into 0.20 mm in thickness.

The tape-like 19-filamentary wire is heat treated in an inert atmosphere at about 825° C. twice for about 5 h and 50 h respectively with intermediate rolling of 10% reduction, and then slowly cooled to room temperature.

As the cost of nickel is significantly lower than that of silver, the overall material cost will be cut by about 3040%.

EXAMPLE 8

This example will illustrate the preparation of a 2223 superconductor tape by a tape casting method.

$Bi_2O_3$, PbO, $SrCO_3$, $CaCO_3$ and CuO, in the cation ratio of Bi, Pb, Sr, Ca and Cu of 1.75:0.35:1.90:2.05:3.05, are dissolved in a nitric acid solution. The solution is then heated up to its boiling temperature until a thick slurry is obtained. The slurry is then moved to a crucible and further dried in an oven. The material is first heated at a temperature below 600° C. for the decomposition of the nitrates. Then the powder is ground and subjected to calcination process as already described in Example 1 to prepare the precursor powder. The particle size of the precursor powder is preferably less than 1 $\mu$m.

For the tape casting, 100 g of the precursor powder was mixed with 1 g of a dispersant (Menhaden fish oil) and 100 ml of a solvent (mixture of toluene and ethanol) and milled with $ZrO_2$ balls for 12 hr. Then 45 g of a binder (polyvinyl butyral Butvar B90) and 20 g of a plasticizer (butyl benzyl phthalate) were added along with additional solvent and milled for 12 hr. The amount of the binder, plasticizer, and solvent should be adjusted to obtain a slurry suitable for tape casting. The slurry was cast into a green tape of 45 $\mu$m in thickness using a doctor-blade tape-caster. Texture of the plate-like 2212 phases is formed in the tape casting process. After evaporation of the solvent, the green tape is flexible. It can be cut into strips or formed into desired shapes such as a thin wall cylinder. After binder burn-out, it can be sintered at about 830° C. in 10% oxygen for 100 hrs.

Strips of sintered superconductor can be used in current leads. Sintered thin wall cylinders can be used as shielding containers.

Other embodiments of the invention will be apparent to those skilled in the art from a consideration of this specification or practice of the invention disclosed herein. It is intended that the specification and examples shall be interpreted as illustrative and not in a limiting sense, with the true scope and spirit of the invention being indicated by the following claims.

I claim:

1. A method of preparing a (Bi,Pb)SrCaCuO-2223 precursor powder, comprising the steps of:

preparing a first powder containing a 2212 fuilly doped phase having a Pb content within ±15 of the final compensation, and non-superconducting phases mixed therewith;

preparing a second powder containing an under-doped 2212 phase having a Pb content less than half the final amount, and non-superconducting phases mixed therewith;

mixing said first powder and said second powder in a proper proportion to obtain the desired cation ratio.

2. A method of preparing a (Bi,Pb)SrCaCuo-2223 precursor powder in accordance with claim 1, wherein Pb is replaced by Sb from 0% to 100%.

3. A method of preparing a SrCaCuO-2223 superconducting wire in accordance with claim 1, wherein the Pb content of said fully doped 2212 phase is within ±10% of the final composition.

4. A method of preparing a SrCaCuO-2223 supercondcuting wire in accordance with claim 1, wherein the Pb content of said fully doped 2212 phase is within ±5% of the final composition.

5. A method of preparing a SrCaCuO-2223 superconducting wire in accordance with claim 1, wherein the Pb content of said under-doped 2212 phase is less than 20% of the final composition.

6. A method of preparing a SrCaCuO-2223 superconducting wire in accordance with claim 1, wherein the Pb content of said under-doped 2212 phase is less than 10% of the final composition.

7. A method of preparing a SrCaCuO-2223 superconducting wire in accordance with claim 1, wherein the volume fraction of said fully doped 2212 phase in said precursor powder is from 10% to 60%.

8. A method of preparing a SrCaCuO-2223 superconducting wire in accordance with claim 1, wherein the volume fraction of said fully doped 2212 phase in said precursor powder is from 20% to 30%.

9. A method of preparing a SrCaCuO-2223 superconducting wire in accordance with claim 1, wherein the particle size of said prescursor powder is less than 2.0 $\mu$m.

10. A method of preparing a (Bi,Pb)SrCaCuO-2223 superconducting wire, comprising the steps of:

preparing a first powder containing a fully doped 2212 phase having a Pb content within ±15 of the final compensation, and non-superconducting phases mixed therewith;

preparing a second powder containing an under-doped 2212 phase having a Pb content less than half the final amount, and non-superconducting phases mixed therewith;

mixing said first powder and said second powder in a proper proportion to form a starting precursor powder;

filling said precursor powder into a metal sheath;

performing deformation processing on said metal sheath to form a composite wire and develop texture in said 2212 phases;

performing thermomechanical processing to obtain the (Bi,Pb)SrCaCuO-2223 phase with a high critical current density;

whereby said fully doped 2212 phase in said first powder acts as a template for enhanced texture formation during sintering so that an improved critical current density is obtained.

11. A method of preparing a (Bi,Pb)SrCaCuO-2223 superconducting wire in accordance with claim 10, wherein Pb is replaced by Sb from 0% to 100%.

12. A method of preparing a (Bi,Pb)SrCaCuO-2223 superconducting wire in accordance with claim 10, further comprising a step of preparing a third powder of non-superconducting oxides, and mixing said first powder, said second powder, and said third powder in a proportion to obtain said precursor powder.

13. A method of preparing a SrCaCuO-2223 superconducting wire in accordance with claim 12, wherein the particle size of said additional powder is less than 1.0 $\mu$m.

14. A method of preparing a SrCaCuO-2223 superconducting wire in accordance with claim 12, wherein the particle size of said additional powder is preferable less than 0.5 μm.

15. A method of preparing a (Bi,Pb)SrCaCuO-2223 superconducting wire in accordance with claim 10, further comprising the steps of
adjusting the oxygen content of said precursor powder close to the value of said (Bi,Pb)SrCaCuO-2223 superconductor;
sealing said metal sheath so that a fixed oxygen content is maintained;
whereby an oxidizing metal can be used to replace a silver-based material as the sheath material to reduce the material cost and to improve the mechanical and thermal properties of said composite wire.

16. A method of preparing a (Bi,Pb)SrCaCuO-2223 superconducting wire in accordance with claim 15, wherein said step of adjusting the oxygen content of said precursor powder is chosen from the group of methods consisting of quenching of the 2212 phases, and using PbO instead of $(Ca,Sr)_2PbO_4$.

17. A method of preparing a SrCaCuO-2223 superconducting wire in accordance with claim 10, wherein the Ph content of said fully doped 2212 phase in within ±10% of the final composition.

18. A method of preparing a SrCaCuO-2223 superconducting wire in accordance with claim 10, wherein the Pb content of said fully doped 2212 phase is within ±5% of the final composition.

19. A method of preparing a SrCaCuO-2223 superconducting wire in accordance with claim 10, wherein the Pb content of said under-doped 2212 phase is less than 20% of the final composition.

20. A method of preparing a SrCaCuO-2223 superconducting wire in accordance with claim 10, wherein the Pb content of said under-doped 2212 phase is less than 10% of the final composition.

21. A method of preparing a SrCaCuO-2223 superconducting wire in accordance with claim 10, wherein the volume fraction of said fully doped 2212 phase in said precursor powder is from 10% to 60%.

22. A method of preparing a SrCaCuO-2223 superconducting wire in accordance with a claim 10, wherein the volume fraction of said fully doped 2212 phase in said precursor powder is from 20% to 30%.

23. A method of preparing a SrCaCuO-2223 superconducting wire in accordance the claim 10, wherein the particle size of said precursor powder is less than 2.0 μm.

24. A method of preparing a (Bi,Pb)SrCaCuO-2223 superconductor, comprising the steps of
preparing a first powder containing a fully doped 2212 phase having a Pb content within ±15 of the final compensation, and non-superconducting phases mixed therewith;
preparing a second powder containing an under-doped 2212 phase having a Pb content less than half the final amount, and non-superconducting phases mixed therewith;
mixing said first powder and said second powder in a proper proportion to form a starting precursor powder;
performing a forming process to develop texture in said 2212 phases;
performing sintering to obtain the (Bi,Pb)SrCaCuO-2223 phase with a high critical current density;
whereby said fully doped 2212 phase in said first powder acts as a template for enhanced texture formation during sintering so that an improved critical current density is obtained.

25. A method of preparing a (BiPb)SrCaCuO-2223 superconductor in accordance with claim 24, wherein said forming process is chosen from the group of methods consisting of tape casting, pressing, dip coating, magnetic alignment, and extrusion.

* * * * *

UNITED STATES PATENT AND TRADEMARK OFFICE
CERTIFICATE OF CORRECTION

PATENT NO. : 6,265,354 B1
DATED : July 24, 2001
INVENTOR(S) : Wu, Hengning

It is certified that error appears in the above-identified patent and that said Letters Patent is hereby corrected as shown below:

Column 1,
Line 9, change "Sr2" to -- $Sr_2$ --.
Line 11, change "Brides" to -- Besides --.

Column 2,
Line 4, change "Srx" to -- $Sr_x$ --.

Column 3,
Line 7 and line 43, start a new paragraph at the beginning of the sentence.

Column 8,
Line 52, change "I mm" to -- 1 mm --.
Lines 29, 32, 35, 56, 58, change "°C." to -- °C --.

Column 9,
Lines 22, 30, 31, 38, 58, change "°C." to -- °C --.
Line 21, change "8 12 hours" to -- 8-12 hours --.

Column 10,
Lines 6, 9, 10, 41, 43, change "°C." to -- °C --.

Column 11,
Lines 10, 25, 45, change "°C." to -- °C --.
Line 14, change "3040%" to -- 30-40% --.

UNITED STATES PATENT AND TRADEMARK OFFICE
CERTIFICATE OF CORRECTION

PATENT NO. : 6,265,354 B1
DATED : July 24, 2001
INVENTOR(S) : Wu, Hengning

It is certified that error appears in the above-identified patent and that said Letters Patent is hereby corrected as shown below:

Claims 1, 10, and 24,
Lines 4 and 5, change "±15 of the final compensation" to -- ±15% of the final composition --.

Claims 3 to 9,
Line 1, change "SrCaCuO-2223 superconducting wire" to -- (Bi,Pb)SrCaCuO-2223 precursor powder --.

Claim 12,
Line 3, change "a third" to -- at least one additional --.
Line 5, change "third" to -- at least one additional --.

Claim 17,
Line 2, change "Ph" to -- Pb --.

Claims 13, 14, 17, 18, 19, 20, 21, 22, 23,
Line 1, change "SrCaCuO-2223" to -- (Bi,Pb)SrCaCuO-2223 --.

Signed and Sealed this

Nineteenth Day of March, 2002

Attest:

JAMES E. ROGAN
*Director of the United States Patent and Trademark Office*

*Attesting Officer*